(12) United States Patent
Frank

(10) Patent No.: US 8,692,624 B2
(45) Date of Patent: Apr. 8, 2014

(54) TUNING OF MEMS OSCILLATOR

(75) Inventor: Michael Frank, Menlo Park, CA (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 0 days.

(21) Appl. No.: 13/326,888

(22) Filed: Dec. 15, 2011

(65) Prior Publication Data
US 2013/0154754 A1    Jun. 20, 2013

(51) Int. Cl.
*H03B 5/30* (2006.01)

(52) U.S. Cl.
USPC .............. 331/116 M; 331/177 V; 331/107 A; 331/96; 331/154

(58) Field of Classification Search
USPC .............. 331/107 A, 96, 116 M, 154, 107 DP
See application file for complete search history.

(56) References Cited

U.S. PATENT DOCUMENTS

| | | |
|---|---|---|
| 5,587,620 A | 12/1996 | Ruby et al. |
| 5,654,680 A | 8/1997 | Kwan |
| 5,873,153 A | 2/1999 | Ruby et al. |
| 6,107,721 A | 8/2000 | Lakin |
| 6,507,983 B1 | 1/2003 | Ruby et al. |
| 7,280,007 B2 | 10/2007 | Feng et al. |
| 7,365,612 B2 | 4/2008 | Rohde et al. |
| 7,388,454 B2 | 6/2008 | Ruby et al. |
| 7,479,847 B2 | 1/2009 | Yamakawa |
| 7,501,903 B2 | 3/2009 | Gabara |
| 7,629,865 B2 | 12/2009 | Ruby |
| 7,889,024 B2 | 2/2011 | Bradley et al. |
| 7,893,784 B2 * | 2/2011 | Hirama ................ 331/163 |
| 2003/0102776 A1 | 6/2003 | Takeda |
| 2004/0227578 A1 | 11/2004 | Hamalainen |
| 2005/0206271 A1 | 9/2005 | Higuchi |
| 2007/0205850 A1 | 9/2007 | Jamneala et al. |
| 2010/0308930 A1 | 12/2010 | Ayazi |
| 2010/0327697 A1 | 12/2010 | Choy |
| 2010/0327994 A1 | 12/2010 | Choy et al. |
| 2011/0109383 A1 | 5/2011 | Lan |

* cited by examiner

Primary Examiner — Arnold Kinkead

(57) ABSTRACT

A method is provided for tuning a microelectromechanical systems (MEMS) oscillator comprising an acoustic resonator and a tuning and amplification circuit arranged in a loop. The method comprises determining an initial oscillation frequency of the oscillator, modifying a capacitance of the tuning and amplification circuit according to the initial oscillation frequency, and adjusting a power level of the oscillator according to the modified capacitance.

23 Claims, 8 Drawing Sheets

TUNING OF MEMS OSCILLATOR

BACKGROUND

Microelectromechanical systems (MEMS) oscillators are commonly used to generate clock signals for electronic devices. A typical MEMS oscillator comprises an amplifying circuit, a resonator that furnishes a native resonance frequency in feedback around the amplifying circuit, and a tuning circuit that tunes the resonant frequency to produce a clock signal at a target frequency. The resonator can be, for instance, a piezoelectric based acoustic resonator, and the tuning and amplifying circuits can be, for instance, a complementary metal oxide semiconductor (CMOS) device.

MEMS resonators are valued because they exhibit much lower loss than resonators that could be realized with conventional processes. The MEMS resonators can be combined with standard integrated circuits in various manners and this combination allows for a more robust design space, increasing the range of available tradeoffs between power consumption, phase noise, and finished product size.

The tuning range of a MEMS oscillator is typically limited to a narrow band of frequencies, and this band is generally constrained by physical properties of the oscillator. Such properties can include, for instance, the native resonance frequency of the resonator, explicit capacitances associated with capacitors or varactors used to tune the oscillator, and parasitic capacitances associated with co-located features of the oscillator. Because all these additional capacitances only lower the frequency of oscillation, the native resonance frequency of the MEMS resonator must be higher than the final desired frequency of the oscillator. Additionally, these adjustable capacitances exhibit increased loss along with increased capacitance.

The tuning range of the MEMS oscillator may also be limited by operating conditions of the oscillator, such as the supplied bias power level. For example, as less power is supplied to the oscillator, the amplitude of its output becomes smaller, which places limits on the amount of attenuation it can withstand from lossy elements such as capacitors and varactors. These limits on the lossy elements can further limit the tuning range of the oscillator.

The tuning range of the MEMS oscillator can also vary based on random factors such as variances in manufacturing processes and changes in temperature during operation. As an example, the resonator may be designed to have a native resonance frequency close to a target frequency of the oscillator. However, due to random variations in manufacturing processes, the actual resonance frequency of the resonator can vary across a range of values. For instance, it may vary according to a Gaussian distribution. If the actual resonance frequency is at a lower end of the range, a relatively small amount of capacitance may be required to tune the oscillator, which can allow the oscillator to operate at a relatively low power level. On the other hand, if the actual resonance frequency is at an upper end of the range, a larger amount of capacitance may be required to tune the oscillator, which may require the oscillator to operate at a higher power level.

Because many electronic devices operate on a strict power budget, it is generally beneficial to minimize power consumption of basic components such as MEMS oscillators. However, due to the above limitations, designers of conventional MEMS oscillators may be required to sacrifice tuning range to achieve lower power consumption.

BRIEF DESCRIPTION OF THE DRAWINGS

The representative embodiments are best understood from the following detailed description when read with the accompanying drawing figures. Wherever applicable and practical, like reference numerals refer to like elements.

DETAILED DESCRIPTION

Figure 1:
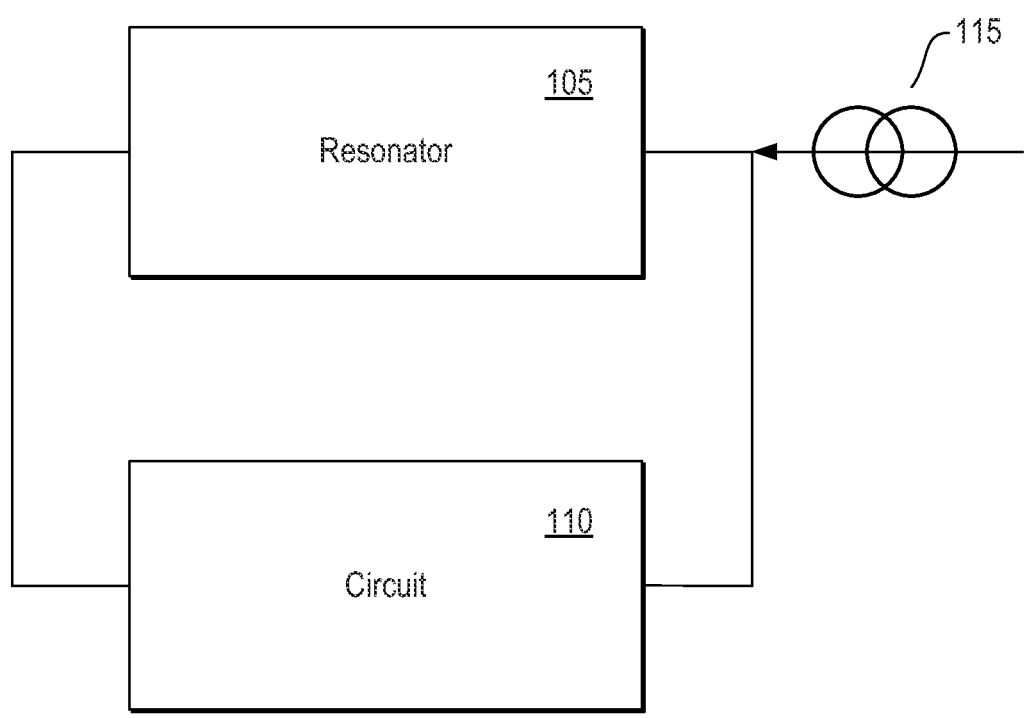
FIG. 1 is a block diagram of a MEMS oscillator according to a representative embodiment.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices. As used in the specification and appended claims, and in addition to their ordinary meanings, the terms 'substantial' or 'substantially' mean to within acceptable limits or degree. As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would then be below that element.

The described embodiments relate generally to the tuning of a MEMS oscillator comprising a resonator and a circuit. The resonator can be, for instance, a piezoelectric based acoustic resonator such as a film bulk acoustic resonator (FBAR), and the circuit can be, for instance, a CMOS circuit. The tuning can be used to compensate for certain variances in manufacturing processes or temperature that may affect a native resonance frequency of the resonator or characteristics of the circuit.

In certain embodiments, the MEMS oscillator is tuned by measuring the unadjusted resonance frequency of the oscillator and then adjusting both the capacitance of the circuit and the power level of the oscillator according to the measured frequency. For example, if the measured frequency is relatively high, the oscillator can be tuned to a lower target frequency by increasing the capacitance of the circuit and then increasing the power level to compensate for the increased losses associated with the increased capacitance. On the other hand, if the measured frequency is relatively low, the oscillator can be tuned to the target frequency by reducing its capacitance and decreasing the power delivered to the oscillator.

In general, increased capacitance tends to attenuate an oscillating signal generated by the oscillator. Accordingly, the increased power level is used to increase the gain of the oscillator to compensate for this attenuation. By adjusting the capacitance and the power level in combination, the described embodiments can potentially minimize the amount of power consumed by the oscillator, which can be beneficial for applications demanding low power consumption.

Although certain embodiments use CMOS circuits, these embodiments can be modified to use other types of circuits, and they are not limited to any particular circuit type, configuration, or fabrication technology. In addition, although certain embodiments use specific types of resonators, such as FBARs, these embodiments can be modified to use other types of resonators, and they are not limited to any particular type of resonator or resonator structure. Moreover, although certain embodiments can be used to implement clocks for digital electronic circuits, the embodiments are not limited to any specific application and they can be used to provide functions other than clocking.

FIG. 1 is a block diagram of a MEMS oscillator 100 according to a representative embodiment. As illustrated in FIG. 1, MEMS oscillator 100 comprises an acoustic resonator 105, a tuning and amplifying circuit 110, and a current source 115.

Current source 115 provides direct current (DC) power to a loop encompassing tuning and amplifying circuit 110 and acoustic resonator 105, allowing them to produce an oscillating signal at a native resonance frequency. Tuning and amplifying circuit 110 is modified to achieve stable oscillation at a target frequency. In other words, the capacitance is modified such that the oscillating signal oscillates at the target frequency, and the amplitude is modified to compensate for any changing attenuation in tuning and amplifying circuit 110.

Tuning and amplifying circuit 110 can be characterized by an open loop gain, which is its gain when acoustic resonator 105 is disconnected from MEMS oscillator 100. The open loop gain of tuning and amplifying circuit 110 is typically adjusted to compensate for losses that it produces. These losses can be caused, for example, by capacitors used to tune the frequency of the oscillating signal, or parasitic capacitances of active elements in tuning and amplifying circuit 110. The open loop gain typically compensates for the losses such that the closed loop gain of MEMS oscillator 100 can achieve unity at the target frequency.

The tuning range of MEMS oscillator 100 is generally confined within a lower bound corresponding to a maximum loss level, and an upper bound corresponding to a minimum loss level. A well designed oscillator does not go into either regime, but can get arbitrarily close. Beyond the maximum loss level, oscillation is quenched or suppressed by the losses. Beyond the minimum loss level, self-oscillation occurs, which can produce an unstable oscillating signal.

As an example of quenching the oscillation, suppose the maximum loss level corresponds to a maximum amount of capacitance that can be incorporated in MEMS oscillator 100 while still allowing it to oscillate. As the capacitance is increased toward the maximum level, the frequency of oscillation decreases toward the lower bound. Then, if the capacitance increases sufficiently, the oscillating signal becomes so attenuated that MEMS oscillator 100 no longer oscillates.

As an example of self-oscillation, suppose the minimum loss level corresponds to less than the minimum amount of capacitance that can be incorporated in the oscillator while maintaining stable oscillation. As the capacitance is decreased toward the minimum level, the frequency of oscillation may increase toward the upper bound. At the same time, however, the open loop gain of tuning and amplifying circuit 110 may increase until the oscillation occurs at a frequency that is no longer principally set by acoustic resonator 105, which can produce unstable operation.

As described in further detail below, certain embodiments expand the tuning range of MEMS oscillator 100 by adjusting its power level to compensate for changes in capacitance or other sources of loss. For example, the tuning range between quenching and self-oscillation can be expanded by increasing the power level to avoid quenching at certain lower frequencies, and decreasing the power level to avoid self-oscillation at certain upper frequencies. Thus, certain embodiments can allow MEMS oscillator 100 to operate at lower power by adjusting its power level in combination with capacitance or other loss inducing parameters.

Figure 2:
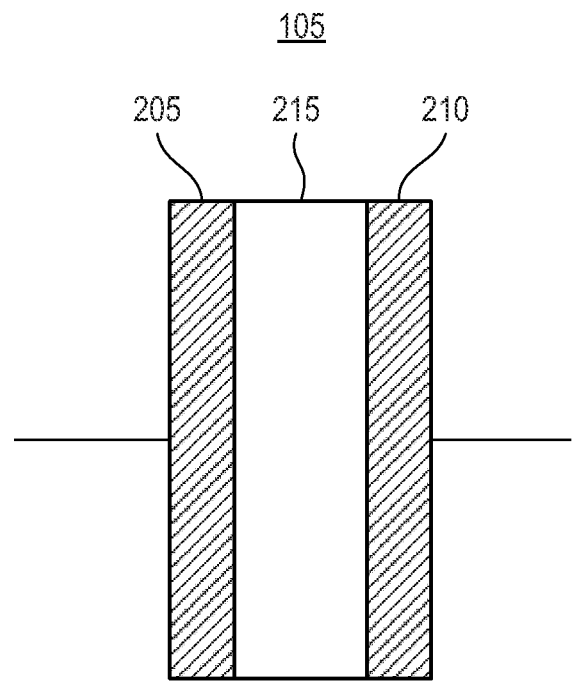
FIG. 2 is a diagram of an acoustic resonator for a MEMS oscillator according to a representative embodiment.

FIG. 2 is a diagram of acoustic resonator 105 according to a representative embodiment. In this embodiment, acoustic resonator 105 is an FBAR. However, acoustic resonator 105 could alternatively be implemented by various other types of resonators.

For example, as an alternative to an FBAR, acoustic resonator 105 could be a double bulk acoustic resonator (DBAR). Certain details of FBARs, DBARs, and other types of acoustic resonators may be found in one or more of the following commonly owned U.S. Patents, Patent Application Publications, and Patent Applications: U.S. Pat. No. 6,107,721, to Lakin; U.S. Pat. Nos. 5,587,620, 5,873,153 and 6.507.983 to Ruby, et al.; U.S. Pat. No. 7,629,865 to Ruby; U.S. Pat. No. 7,280,007 to Feng, et al.; U.S. Patent Application Publication 20070205850 to Jamneala, et al.; U.S. Pat. No. 7,388,454 to Ruby, et al; U.S. Patent Application Publication 20100327697 to Choy, et al.; and U.S. Patent Application Publication 20100327994 to Choy, et al. Examples of stacked bulk acoustic resonators, as well as their materials and methods of fabrication, may be found in U.S. Pat. No. 7,889,024 to Bradley et al. The disclosures of these patents and patent applications are specifically incorporated herein by reference. The components, materials and method of fabrication described in these patents and patent applications are representative, and other methods of fabrication and materials within the purview of one of ordinary skill in the art are contemplated.

Referring to FIG. 2, acoustic resonator 105 comprises a first electrode 205, a second electrode 210, and a piezoelectric material 215 located between first and second electrodes 205 and 210. As illustrated in FIG. 1, acoustic resonator 105 is wired in parallel with tuning and amplifying circuit 110. During operation, a current is supplied to tuning and amplifying circuit 110, causing it to exhibit gain, and incidentally generate noise. The noise that happens to be of a frequency that can pass through acoustic resonator 105 gets amplified, and through this action grows larger until tuning and amplifying circuit 110 is saturated. Thus is the requirement for oscillation satisfied. The oscillation takes place at the approximate frequency of resonance of acoustic resonator 105.

Acoustic resonator 105 is generally designed to have a native resonance frequency close to the target frequency of MEMS oscillator 100. However, it is difficult to ensure a precise value of the native resonance frequency due to random variations in the processes used to manufacture acoustic resonator 105. For instance, there can be minor variations in the shape or thickness of piezoelectric material 215 that can modify its native resonance frequency within a random distribution. Accordingly, in certain embodiments, the native resonance frequency of acoustic resonator 105 is measured as part of the process of tuning MEMS oscillator 100. This measurement can then be used to determine how to adjust tuning and amplifying circuit 110 and/or current source 115 when tuning MEMS oscillator 100.

The measurement of the native resonance frequency of acoustic resonator 105 can be performed in a variety of ways. For example, it can be measured in isolation through the use of a network analyzer or other measurement instrument, or it can be measured in the context of MEMS oscillator 100 by probing the oscillating signal.

Figure 3:
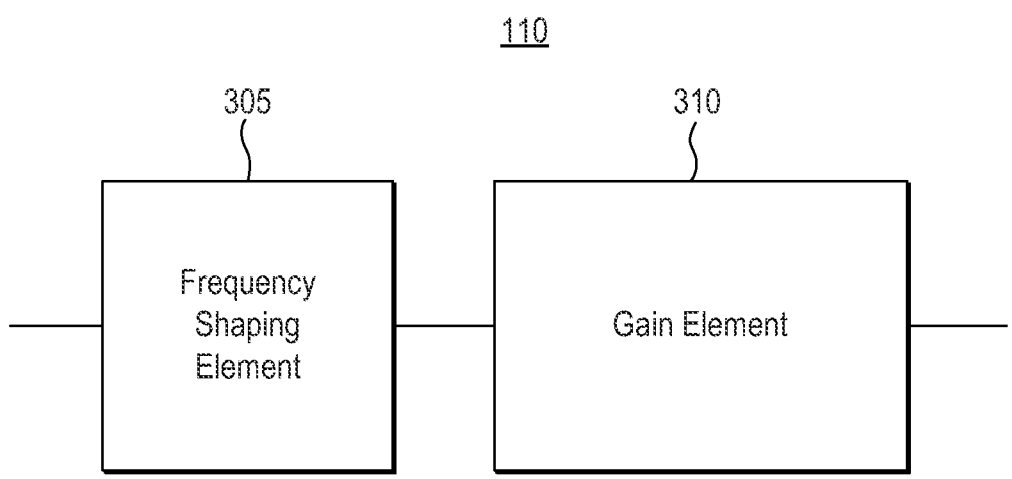
FIG. 3 is a block diagram of a tuning and amplifying circuit for a MEMS oscillator according to a representative embodiment.

FIG. 3 is a block diagram of tuning and amplifying circuit 110 according to a representative embodiment. As illustrated in FIG. 3, tuning and amplifying circuit 110 comprises a frequency shaping element 305 and a gain element 310. Although FIG. 3 shows frequency shaping element 305 and gain element 310 as distinct elements connected in series, tuning and amplifying circuit 110 can be implemented with gain and frequency shaping components in various alternative configurations.

Frequency shaping element 305 is used to adjust the frequency of the oscillating signal, and gain element 310 is used to adjust the gain of the oscillating signal such that the overall loop gain of MEMS oscillator 100 is unity. In a typical implementation, frequency shaping element 305 comprises passive elements such as capacitors, while gain element 310 comprises active elements such as one or more field effect transistors (FETs) or bipolar junction transistors (BJTs). In certain embodiments, one or more variable capacitors are used in frequency shaping element 305 to control the frequency response of tuning and amplifying circuit 110, and one or more transistors are used as in gain element 310 to adjust the gain of tuning and amplifying circuit 110.

Figure 4:
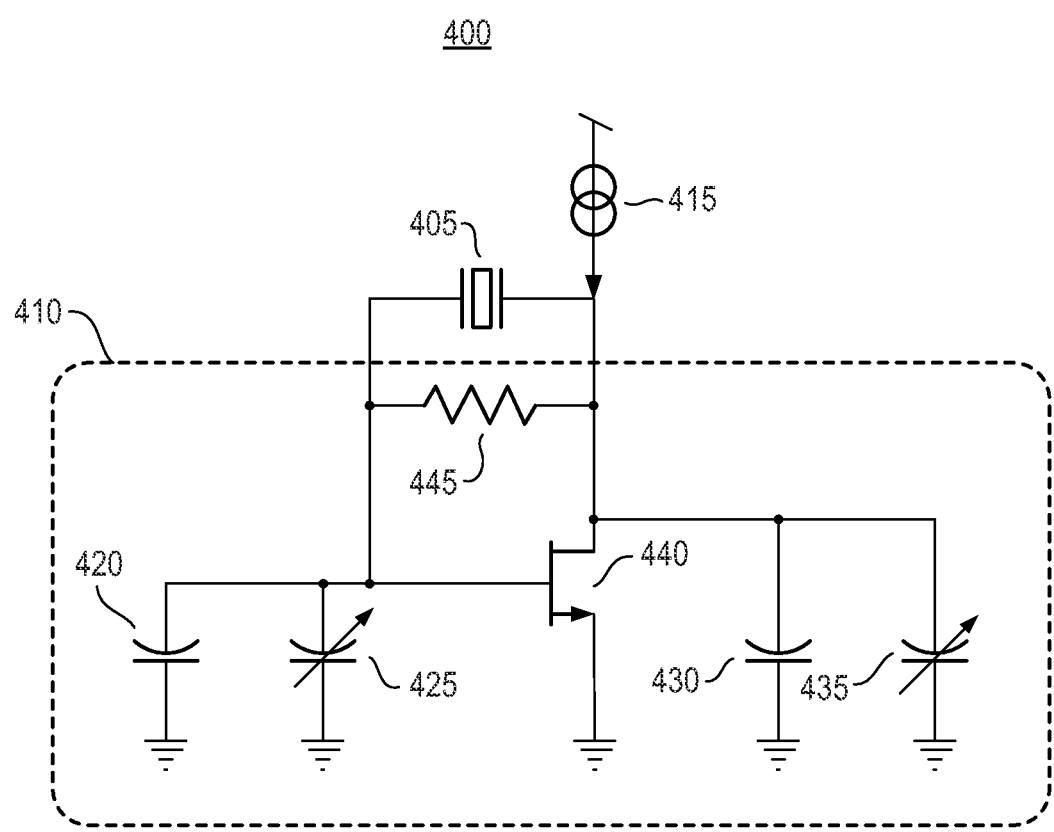
FIG. 4 is a block diagram of a MEMS oscillator according to a representative embodiment.

FIG. 4 is a block diagram of a MEMS oscillator 400 according to a representative embodiment. MEMS oscillator 400 represents one possible implementation of MEMS oscillator 100 of FIG. 1. Due to its configuration, MEMS oscillator 400 can be referred to as a Colpitts type oscillator.

Referring to FIG. 4, MEMS oscillator 400 comprises a resonator 405, a tuning and amplifying circuit 410, and a current source 415. Tuning and amplifying circuit 410 comprises fixed capacitors 420 and 430, variable capacitors 425 and 435, an N-type FET 440, (referred to below as "FET 440"), and a resistor 445. Resonator 405 comprises an FBAR connected in parallel with tuning and amplifying circuit 410 and having one end connected to current source 415.

During operation of MEMS oscillator 400, current source 415 applies a current that biases FET 440 in its linear region given that resistor 445 ensures that FET 440 gate to source voltage is substantially equal to FET 440 drain to source voltage. This allows FET 440 to function as an amplifier. In combination with resonator 405, tuning and amplifying circuit 410 achieves oscillation at the frequency native to the overall circuit resonance. This produces an oscillating signal that passes around a loop encompassing resonator and tuning and amplifying circuit 410. The oscillating signal is amplified by FET 440 and modified by capacitors 420 through 435. The gain of FET 440 is set to produce an overall loop gain of unity, and variable capacitors 425 and 435 are adjusted to tune the oscillating signal to a target frequency.

Variable capacitors 425 and 435 are typically implemented by switched capacitors each comprising a capacitor in series with a transistor. These transistors typically look like much smaller capacitors when off, or small resistors when on. Variable capacitors 425 and 435 could also be implemented with varactors, or a combination of varactors and switched capacitors. Accordingly, increasing or decreasing the tuning capacitance can increase or decrease losses in MEMS oscillator 400.

FET 440 can be controlled to compensate for losses caused by the tuning capacitance of MEMS oscillator 400, and to extend the tuning range of MEMS oscillator 400. For example, in FET 440, the channel current, capacitance, and gain in the linear range, all increase with the gate to source voltage. Accordingly, the gate to source voltage can be changed along with the tuning capacitance to compensate for changed losses due to the changed capacitance. In addition, the capacitance of FET 440 can be incorporated into the tuning capacitance to extend the tuning range of MEMS oscillator 400.

The gate to source voltage of FET 440 can be changed by any of various techniques. For example, the voltages applied to the gate and/or source nodes could be modified explicitly. Alternatively, if FET 440 is self biased, the current injected could be changed. Any technique that changes the voltage will thus change both the gain and the associated capacitance.

Although FET 440 is used as an example gain element in FIG. 4, it can be replaced by one or more bipolar transistors in alternative embodiments. In such embodiments, a change in the base current can produce a change in the transistor capacitance, as well as a change in the open loop gain. These changes can be incorporated into the frequency control capacitance to extend the tuning range of MEMS oscillator 400.

Figure 5:
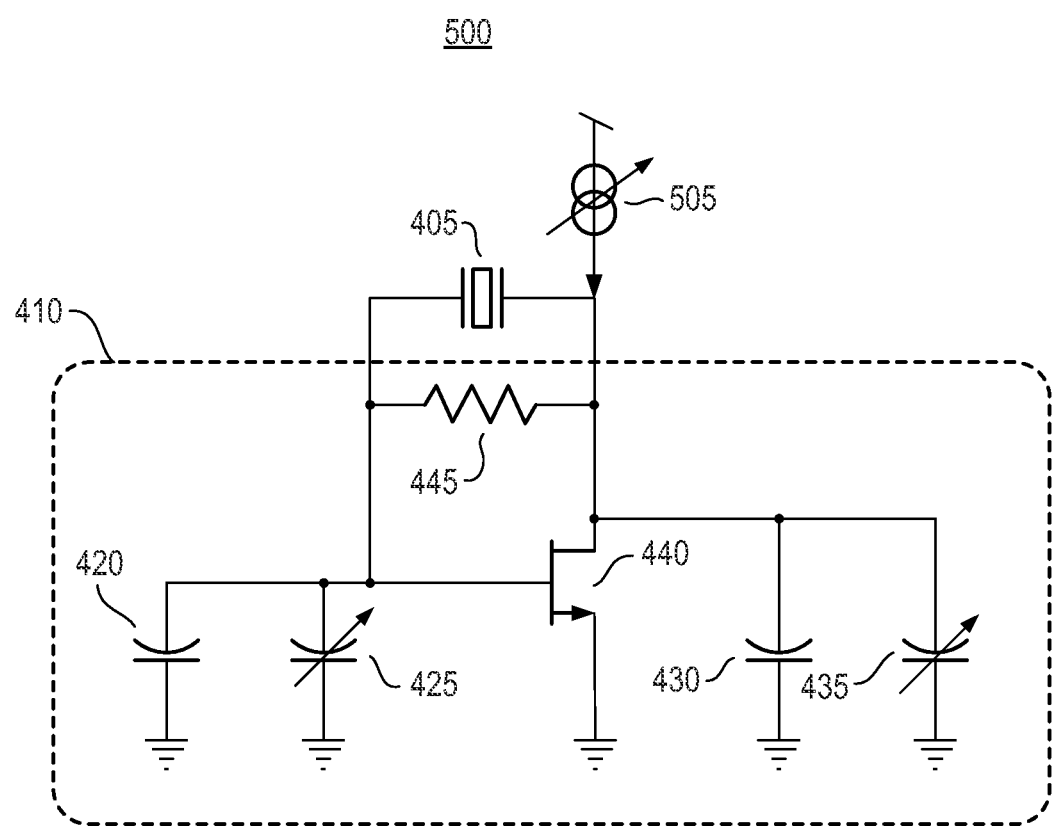
FIG. 5 is a circuit diagram of a MEMS oscillator according to another example embodiment.

FIG. 5 is a circuit diagram of a MEMS oscillator 500 according to another example embodiment. MEMS oscillator 500 is substantially the same as MEMS oscillator 400, except that MEMS oscillator 500 uses a variable current source 505 to change the gate to source voltage of FET 440. As explained above, adjusting the supplied current is merely one way to change the gate to source voltage of FET 440 to control the loop gain and tuning range of an oscillator.

Where the target frequency of MEMS oscillator 500 is close to the native resonance frequency of resonator 405, the tuning capacitance is set to near a minimum. In this state, FET 440 has relatively low gate to source voltage, and MEMS oscillator 500 has a relatively low gain and low current. Because the gain is low, MEMS oscillator 500 has a low tendency to self-oscillate.

On the other hand, where the target frequency of MEMS oscillator 500 is relatively far below the native resonance frequency of the resonator, the tuning capacitance may be set near a maximum. As the frequency decreases below the native resonance frequency, the tuning capacitance is increased along with the gate to source voltage of FET 440, resulting in increased gain and increased current. The increased gain maintains oscillation even though loop losses increase with the tuning capacitance. This extends the frequency range before MEMS oscillator 500 is quenched.

Figure 6:
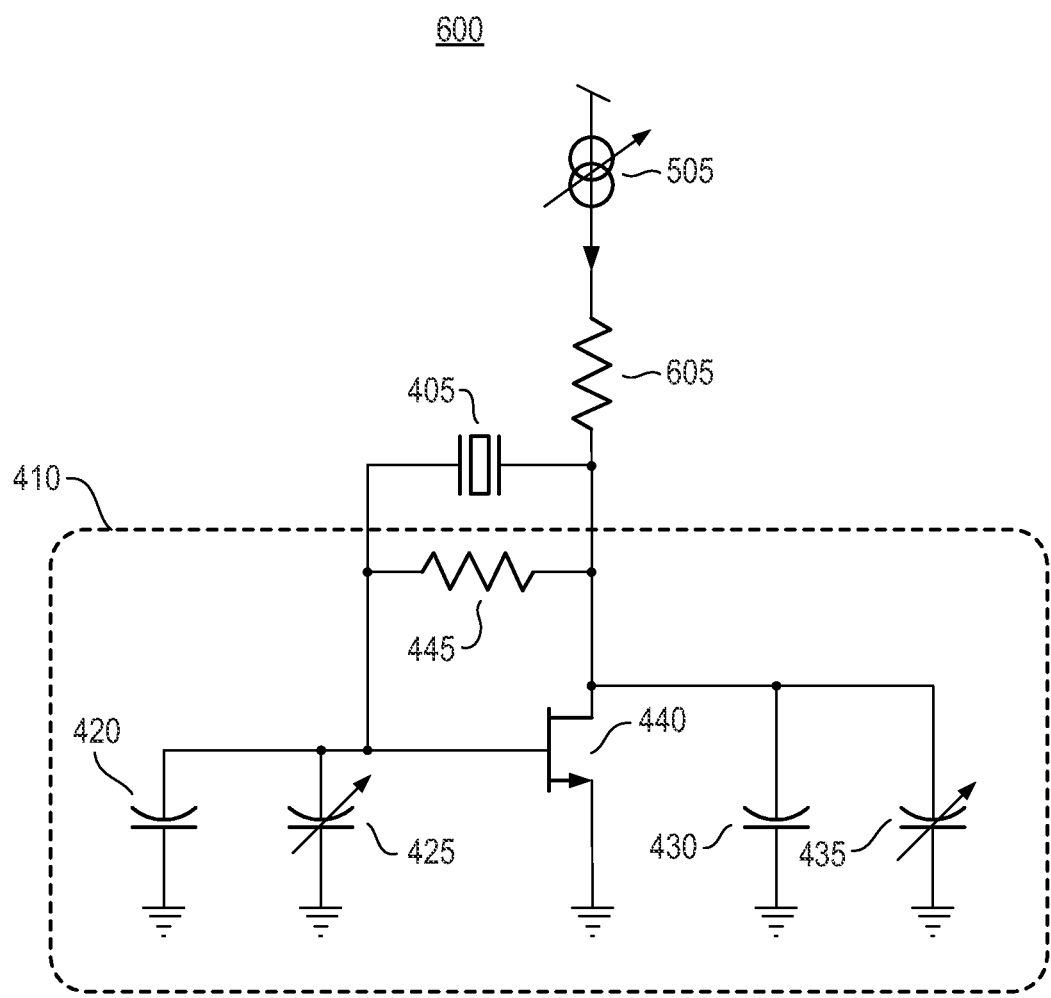
FIG. 6 is a circuit diagram of a MEMS oscillator according to yet another example embodiment.

FIG. 6 is a circuit diagram of a MEMS oscillator 600 according to yet another example embodiment. MEMS oscillator 600 is substantially the same as MEMS oscillator 500, except that MEMS oscillator 600 includes an additional resistor 605 in a main current path between variable current source 505 and resonator 405.

Resistor 605 can be used to change the relationship between the current generated by variable current source 505 and the gate to source voltage of FET 440. This will tend to modify the amount of current adjustment required to compensate for adjusted tuning capacitances. Resistor 605 can be similarly used in an oscillator using a BJT in place of FET 440.

Figure 7:
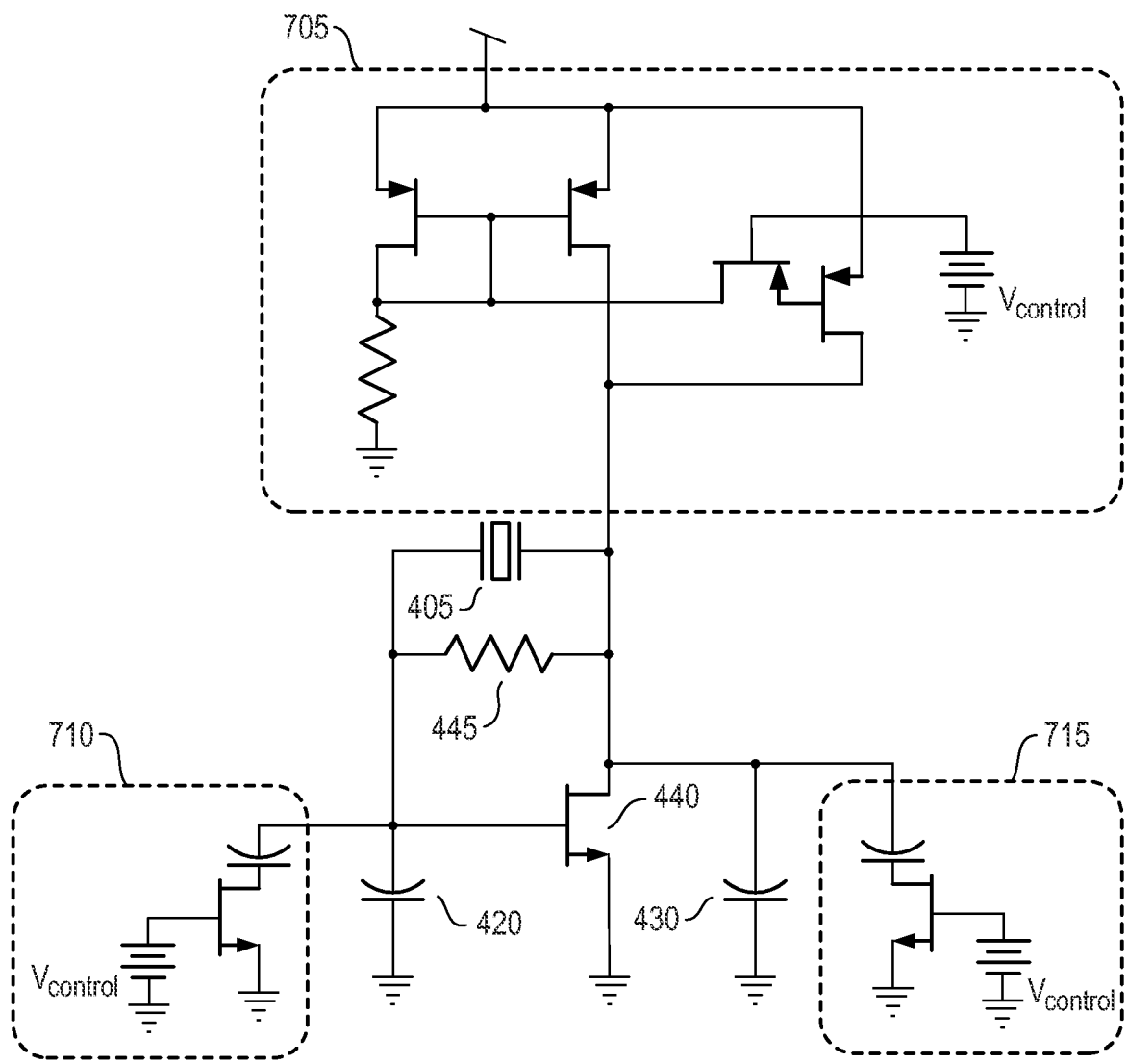
FIG. 7 is a circuit diagram of a MEMS oscillator according to still another example embodiment.

FIG. 7 is a circuit diagram of a MEMS oscillator 700 according to still another example embodiment. This embodiment provides one possible mechanism for adjusting the amount of current supplied by variable current source 505 and one possible mechanism for tuning variable capacitors 425 and 435.

Referring to FIG. 7, MEMS oscillator 700 has the same features as MEMS oscillator 500 of FIG. 5, except that MEMS oscillator 700 comprises a variable current source 705 and switched capacitors 710 and 715 in place of variable current source 505 and variable capacitors 425 and 435, respectively. Variable current source 705 comprises a current mirror controlled by a variable control voltage. Switched capacitors 710 and 715 each comprise a capacitor arranged in series with a transistor controlled by a variable control voltage. The variable control voltage of variable current source 705 can be adjusted to increase or decrease the amount of current provided to MEMS oscillator 700, and the variable control voltages of switched capacitors 710 and 715 can be adjusted to increase or decrease the respective capacitors.

Figure 8:
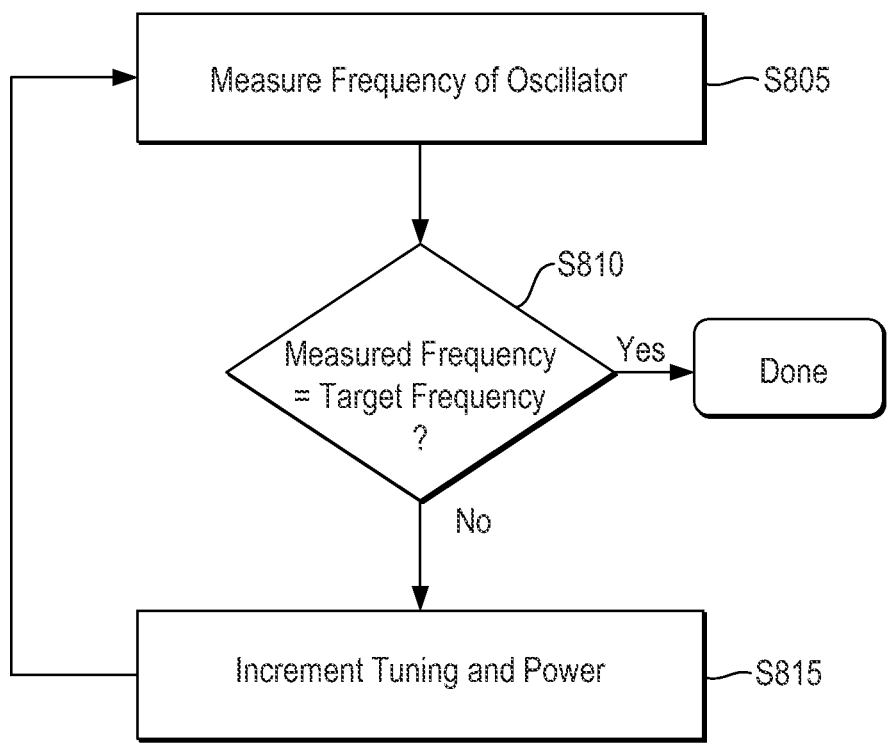
FIG. 8 is a flowchart illustrating a method of tuning a MEMS oscillator according to a representative embodiment.
Figure 9:
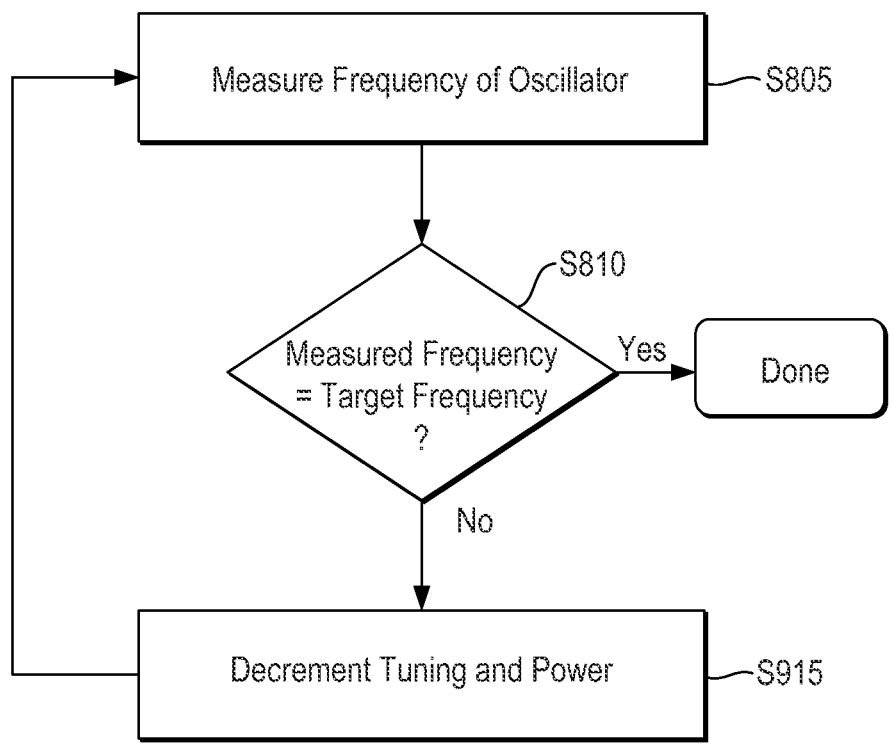
FIG. 9 is a flowchart illustrating a method of tuning a MEMS oscillator according to another example embodiment.

FIGS. 8 and 9 are flowcharts illustrating methods of tuning an oscillator according to example embodiments. For explanation purposes, it will be assumed that the methods of FIGS. 8 and 9 are performed in the context of MEMS oscillator 500 of FIG. 5. However, these methods could alternatively be performed with other types of oscillators.

The methods of FIGS. 8 and 9 are iterative procedures in which the tuning and power of MEMS oscillator 500 are iteratively adjusted until a target frequency is achieved. In the method of FIG. 8, it is assumed that MEMS oscillator 500 has an initial oscillation frequency above the target frequency. Accordingly, tuning parameters and power of MEMS oscillator 500 are incremented to achieve the target frequency. On the other hand, in the method of FIG. 9, it is assumed that MEMS oscillator 500 has an initial oscillation frequency below the target frequency. Accordingly, tuning parameters and power of MEMS oscillator 500 are decremented to achieve the target frequency.

Referring to FIG. 8, the method begins by measuring an initial oscillation frequency of MEMS oscillator 500 (S805). This can be accomplished by biasing MEMS oscillator 500 prior to adjustment of the variable capacitors 425 and 435 and comparing its response against a target response.

This determination of the initial oscillation frequency can be used to calibrate MEMS oscillator 500 for variations of the native resonant frequency of resonator 405. It can also be used to calibrate MEMS oscillator 500 for variations in temperature. Accordingly, subsequent steps in the method of FIG. 8 can be used to compensate for these different variables.

Next, the method determines whether the measured frequency is approximately the same as the target frequency of MEMS oscillator 500 (S810). This can be accomplished, for instance, by determining whether a difference between the measured frequency and the target frequency is smaller than a predetermined amount. Upon determining that the measured frequency is approximately the same as the target frequency (S810=Yes), the method is terminated and MEMS oscillator 500 is assumed to be tuned. Otherwise (S810=No), the tuning parameters and power level of MEMS oscillator 500 are incremented by a predetermined amount (S815), and the method returns to step S810.

The tuning parameters and power level of MEMS oscillator 500 can be incremented using techniques such as those described above in relation to FIGS. 4 through 7. For instance, they can be incremented using variable current source 505 and variable capacitors 425 and 435. The modification of capacitance can be accomplished, for instance, by closing switches of switched capacitors such as those illustrated in FIG. 7. Moreover, the switches can be set to close permanently after the capacitance has been adjusted.

In general, the adjustment of the current can be performed sequentially or concurrently with the adjustment of the capacitance. In addition, the adjustment of these parameters can be performed manually or automatically. Typically, if the capacitance is increased by a relatively large amount, the current will be increased by a commensurately large amount. Otherwise, if the capacitance is increased by a relatively small amount, the current can be increased by a commensurately small amount.

Referring to FIG. 9, if the initial oscillation frequency is below the target frequency, the method is performed the same as in FIG. 8, except that step S815 is replaced by a step S915 in which the tuning parameters and power level of oscillator are decremented rather than incremented. Accordingly, the oscillation frequency is incrementally increased until it reaches the target frequency or a target frequency range.

While representative embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A method of tuning a microelectromechanical systems (MEMS) oscillator comprising an acoustic resonator and a tuning and amplification circuit arranged in a loop, the method comprising:

determining an oscillation frequency of the oscillator;

modifying a capacitance of the tuning and amplification circuit according to the oscillation frequency, wherein the modifying comprising: (a) incrementing the capacitance by a predetermined amount; (b) determining a difference between the oscillation frequency and a target frequency; and (c) upon determining that the difference is sufficiently large, repeating (a) and (b) until the difference is determined to be lower than a predetermined amount;

adjusting a power level of the oscillator according to the modified capacitance;

determining whether the oscillation frequency has reached a target frequency;

upon determining that the oscillation frequency has not reached the target frequency, iteratively repeating the modifying and adjusting; and adjusting the power level of the oscillator by a predetermined amount each time the capacitance is incremented.

2. The method of claim 1, wherein the tuning and amplification circuit comprises a field effect transistor (FET) biased to a linear region, and adjusting the power level of the oscillator comprises adjusting a gate to source voltage of the FET.

3. The method of claim 1, wherein the tuning and amplification circuit comprises a bipolar junction transistor (BJT) biased to a linear region, and adjusting the power level of the oscillator comprises adjusting a base current of the BJT.

4. The method of claim 1, wherein the acoustic resonator comprises a film bulk acoustic resonator (FBAR) and the tuning and amplification circuit comprises a transistor, at least one fixed capacitor, and at least one variable capacitor.

5. The method of claim 4, wherein the at least one variable capacitor comprises a switched capacitor, and modifying the capacitance of the tuning and amplification circuit comprises closing a switch of the switched capacitor.

6. A microelectromechanical systems (MEMS) oscillator, comprising;
an acoustic resonator;
a tuning and amplification circuit connected with the resonator in a loop and having an adjustable gain and capacitance, wherein the tuning and amplification circuit is configured to tune the oscillator to a target frequency by modifying the adjustable gain and capacitance;
an adjustable power source connected to the loop and configured to adjust an amount of power supplied to the loop according to the capacitance of the tuning and amplification circuit, wherein the adjustable power source comprises an adjustable current source; wherein the tuning and amplification circuit and adjustable power source are configured to iteratively repeat the modification of the adjustable gain and capacitance and the adjustment of the power as a consequence of a determination that the oscillation frequency has not reached a target frequency.

7. The MEMS oscillator of claim 6, wherein the tuning and amplification circuit comprises:
a transistor having a first terminal connected to one side of the loop, a second terminal connected to another side of the loop, and a third terminal connected to a reference voltage; and
at least one variable capacitor connected to the first terminal or the second terminal.

8. The MEMS oscillator of claim 7, wherein the transistor is a field effect transistor (FET), the first terminal is a gate terminal, the second terminal is a drain terminal, and the third terminal is a source terminal, and
wherein the adjustable power source adjusts the amount of power supplied to the loop to increase a gate to source voltage of the FET to compensate for an increased capacitance of the tuning and amplification circuit.

9. The MEMS oscillator of claim 6, wherein the tuning and amplification circuit comprises:
a field effect transistor (PET) having a source connected to a reference voltage;
a first fixed capacitor connected between a gate of the EFT and the reference voltage;
a first variable capacitor connected between the gate of the FET and the reference voltage;
a second fixed capacitor connected between a drain of the FET and the reference voltage;
a second variable connected between the drain of the FET and the reference voltage; and
a resistor connected in parallel with the resonator.

10. The MEMS oscillator of claim 9, wherein the MEMS oscillator further comprises a resistor located between the current source and the loop.

11. The MEMS oscillator of claim 6, wherein the tuning and amplification circuit comprises at least one switched capacitor configured to adjust the capacitance.

12. The MEMS oscillator of claim 6, wherein the resonator is a film bulk acoustic resonator (FBAR).

13. The MEMS oscillator of claim 6, wherein the tuning and amplification circuit comprises at least one varactor configured to adjust the capacitance.

14. A method of tuning an oscillator comprising an acoustic resonator and a tuning and amplification circuit connected in a loop, wherein the tuning and amplification circuit comprises a transistor and a plurality of tuning capacitors, the method comprising:
increasing a capacitance of the tuning capacitors in combination with a gate to source voltage of the transistor, wherein increasing the gate to source voltage of the transistor comprises increasing a current applied to the loop;
determining whether an oscillation frequency of the oscillator has reached a target frequency; and
upon determining that the oscillation frequency has not reached the target frequency, iteratively repeating the increasing the capacitance of the tuning capacitors in combination with a gate to source voltage of the transistor.

15. The method of claim 14, wherein increasing the tuning capacitance comprises determining an initial oscillating frequency of the oscillator, and increasing the tuning capacitance in proportion to a difference between the initial oscillating frequency and a target oscillating frequency.

16. A microelectromechanical systems (MEMS) oscillator, comprising;
an acoustic resonator;
a tuning and amplification circuit connected with the resonator in a loop and having an adjustable gain and capacitance, wherein the tuning and amplification circuit is configured to tune the oscillator to a target frequency by modifying the adjustable gain and capacitance;
an adjustable power source connected to the loop and configured to adjust an amount of power supplied to the loop according to the capacitance of the tuning and amplification circuit, wherein the tuning and amplification circuit and adjustable power source are configured to iteratively repeat the modification of the adjustable gain and capacitance and the adjustment of the power as a consequence of a determination that the oscillation frequency has not reached a target frequency.

17. The MEMS oscillator of claim 16, wherein the tuning and amplification circuit comprises:
a transistor having a first terminal connected to one side of the loop, a second terminal connected to another side of the loop, and a third terminal connected to a reference voltage; and
at least one variable capacitor connected to the first terminal or the second terminal.

18. The MEMS oscillator of claim 17, wherein the transistor is a field effect transistor (FET), the first terminal is a gate terminal, the second terminal is a drain terminal, and the third terminal is a source terminal, and
wherein the adjustable power source adjusts the amount of power supplied to the loop to increase a gate to source voltage of the FET to compensate for an increased capacitance of the tuning and amplification circuit.

19. The MEMS oscillator of claim 16, wherein the tuning and amplification circuit comprises:
a field effect transistor (FET) having a source connected to a reference voltage;

a first fixed capacitor connected between a gate of the FET and the reference voltage;
a first variable capacitor connected between the gate of the FET and the reference voltage;
a second fixed capacitor connected between a drain of the FET and the reference voltage;
a second variable connected between the drain of the FET and the reference voltage; and
a resistor connected in parallel with the resonator.

20. The MEMS oscillator of claim 19, wherein the adjustable power source comprises a current source, and the MEMS oscillator further comprises a resistor located between the current source and the loop.

21. The MEMS oscillator of claim 16, wherein the tuning and amplification circuit comprises at least one switched capacitor configured to adjust the capacitance.

22. The MEMS oscillator of claim 16, wherein the resonator is a film bulk acoustic resonator (FBAR).

23. The MEMS oscillator of claim 16, wherein the tuning and amplification circuit comprises at least one varactor configured to adjust the capacitance.

* * * * *